(12) United States Patent
Bao et al.

(10) Patent No.: US 6,596,569 B1
(45) Date of Patent: Jul. 22, 2003

(54) THIN FILM TRANSISTORS

(75) Inventors: Zhenan Bao, North Plainfield, NJ (US); Peter Kian-Hoon Ho, North Plainfield, NJ (US); Yueh-Lin Loo, Princeton, NJ (US); John A. Rodgers, New Providence, NJ (US); Takao Someya, New Providence, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 10/098,201

(22) Filed: Mar. 15, 2002

(51) Int. Cl.⁷ .................. H01L 21/00; H01L 21/30; H01L 21/31
(52) U.S. Cl. .................. 438/151; 438/149; 438/459; 438/778
(58) Field of Search .................. 438/151, 149, 438/459, 778

(56) References Cited

U.S. PATENT DOCUMENTS 6,127,199 A * 10/2000 Inoue et al.
6,197,663 B1 * 3/2001 Chandross et al.

* cited by examiner

Primary Examiner—John F. Niebling
Assistant Examiner—Stanetta Isaac

(57) ABSTRACT

The specification describes a lamination method for thin film transistor TFT devices wherein each ply of the laminate is a polymer and each contains a portion of the TFT or the interconnection circuit. The plies are laminated together using a solid adhesive polymer layer on the surface of one or both of the plies. The solid adhesive polymer layer has a low elastic modulus that provides effective encapsulation of the TFT, and laminates the plies without high heat or pressure.

16 Claims, 6 Drawing Sheets

THIN FILM TRANSISTORS

FIELD OF THE INVENTION

This invention relates to improvements in thin film transistors (TFTs), and more particularly to improvements in TFT devices with organic semiconductors.

BACKGROUND OF THE INVENTION (The following section contains background material that, unless specifically stated otherwise, may or may not be prior art).

Over the last decade, IC technologies have been proposed that use organic semiconductor thin film transistors (TFTs). The chief attractions of such circuits stem from the anticipated ease of processing and compatibility with flexible substrates. These advantages are expected to translate into a low-cost IC technology suitable for applications such as smart cards, electronic tags, and displays.

TFT devices are described in F. Gamier et al., Science, Vol. 265, pp. 1684–1686; H. Koezuka et al., Applied Physics Letters, Vol. 62 (15), pp. 1794–1796; H. Fuchigami et al., Applied Physics Letters, Vol. 63 (10), pp. 1372–1374; G. Horowitz et al., J. Applied Physics, Vol. 70(1), pp. 469475; and G. Horowitz et al., Synthetic Metals, Vol. 42–43, pp. 1127–1130. The devices described in these references are based on polymers or oligomers as the active materials, in contrast with the amorphous silicon and polysilicon TFT structures that were developed earlier. The devices are typically field effect transistors (FETs). Polymer active devices have significant advantages over semiconductor TFTs in terms of simplicity of processing and resultant low cost. They are also compatible with polymer substrates used widely for interconnect substrates. Polymer TFTs are potentially flexible, and polymer TFT ICs can be formed directly on flexible printed circuit boards. They also have compatible coefficients of thermal expansion so that solder bonds, conductive expoxy bonds, and other interconnections experience less strain than with semiconductor IC/polymer interconnect substrate combinations. While metal-insulator-semiconductor (MIS) FET devices are most likely to find widespread commercial applications, TFT devices that utilize both p-type and n-type organic active materials are also known. See e.g., U.S. Pat. No. 5,315,129. S. Miyauchi et al., Synthetic Metals, 41–43 (1991), pp. 1155–1158, disclose a junction FET that comprises a layer of p-type polythiophene on n-type silicon.

Recent advances in polymer based TFT devices are described in U.S. Pat. No. 5,596,208, issued May 10, 1996, U.S. Pat. No. 5,625,199, issued Apr. 29, 1997, and U.S. Pat. No. 5,574,291, issued Nov. 12, 1996. With the development of both n-type and p-type active polymer materials, as described in these patents, complementary ICs can be readily implemented, as detailed particularly in U.S. Pat. No. 5,625,199.

With the basic organic TFT technology now well established, refinements in the device structures and processing can be expected. Electronic systems that combine plastic substrates and printing techniques with new classes of organic, hybrid organic-inorganic, or solution-derived inorganic semiconductors represent important emerging technologies. See for example: C. A. Mirkin, J. A. Rogers, MRS Bull. 26, 530 (2001); Z. Bao, J. A. Rogers, H. E. Katz, J. Mater. Chem. 9, 1895 (1999); C. R. Kagan, D. B. Mitzi, C. D. Dimitrakopoulos, Science 286,945 (1999); B. A. Ridley, B. Nivi, J. M. Jacobson, Science 286,746 (1999); R. F. Service, Science 287,415 (2000).

Plastic circuits have attractive characteristics that are difficult to achieve with materials and methods used for conventional electronics: they are mechanically flexible, durable and lightweight, and they can be printed over large areas. Recent advances in TFT fabrication methods use lamination techniques wherein part of the transistor structure is formed on one substrate and the remaining transistor elements are formed on another substrate. The two substrates are then joined together to complete the transistor. They also have the potential to be ultralow in cost partly because they are compatible with continuous, high speed reel-to-reel fabrication techniques. See H. Sirringhaus et al, Science 290, 2123 (2000); J. A. Rogers, Z. Bao, A. Makhija, Adv. Mater. 11, 741 (1999); C. J. Drury, C. M. J. Mutsaers, C. M. Hart, M. Matters, D. M. de Leeuw, Appl.; and U.S. Pat. No. 6,197,663, issues Mar. 6, 2001. These references are incorporated by reference herein for processing details. In this method, the flexible substrates that are to be joined together are formed on a continuous flexible tape, and the tapes reeled on a rotating drum. Joining the two tapes together simply involves unreeling them from drums, and spooling them together in mating relationship. Pressure or simple contact, or a curing influence such as heat or UV radiation, bonds the tapes together to form a single tape. The single tape is cut as desired to form individual TFT transistors, or groups of transistors. The tapes may even carry simple transistor circuits.

As a result, plastic circuits will form the foundations for future devices—electronic paper, wearable sensors, low cost smart cards and RF identification tags, flexible arrays of plastic microphones, etc.—that will complement the types of systems that established electronics supports well (e.g. microprocessors, high density RAM).

Recent results demonstrate several promising combinations of materials and patterning techniques for small (several transistors) to medium (several hundred transistors) scale plastic circuits. These systems, however, are fabricated in a general approach that was borrowed from conventional silicon microelectronics: they are built by depositing and patterning one material layer after another on a single substrate. Designing sets of chemically compatible solution-processable materials that can be reliably deposited on top of plastic substrates and on top of one another in this layer-by-layer approach is challenging. Requirements that follow from this fabrication strategy often lead to transistor and circuit geometries that are not optimized for electrical performance. Similar concerns make it difficult to incorporate designs that improve the mechanical flexibility of the circuits. Efficient and general means for encapsulating the devices are also lacking; their environmental stability is, as a result, typically poor or unknown.

The lamination approach has proven reliable and cost effective. However, improvements in the lamination technique continue to be sought in order to further reduce cost and increase reliability.

STATEMENT OF THE INVENTION

The invention described in more detail below is a method for using 'soft', conformable electrical contacts and lamination procedures to fabricate printed plastic circuits. In this approach, different parts of a circuit are fabricated on different substrates; at least one of these incorporates high resolution, conformable electrical contacts. Bonding the substrates together forms embedded, high performance circuits. According to the invention, the substrates are bonded together using solid adhesive polymer layers of low elastic modulus. These materials form a reliable bond under conditions that allow fast and controllable adhesion, suitable for reel-to-reel assembly mentioned above. The bond conditions include room temperature to 150° C., and zero to 50 psi pressure.

This approach has many practical advantages, including the ability (i) to separate many of the patterning and deposition steps, (ii) to enable transistors with geometries that are conducive to high performance, (iii) to produce embedded circuits that are highly resistant to fracture during bending, and (iii) to form completely encapsulated devices.

In the preferred embodiment a first flexible polymer substrate is coated with the low modulus solid adhesive polymer layer. The TFT elements are formed on the solid adhesive polymer layer, and the first flexible polymer layer is laminated to a second flexible polymer layer using the solid adhesive polymer layer to bond the first and second substrates together. Reference to TFT elements includes the electrical contacts for source, drain or gate, or printed interconnections for those transistor elements, and the semiconductor layer of the TFT. The solid adhesive polymer layer functions both as a substrate or support for the TFT elements, and an adhesive for the laminating the plies together. In a second embodiment, one or more TFT elements are formed on a solid adhesive polymer layer on the first flexible substrate, and one or more TFT elements are formed on a second solid adhesive polymer layer on the second flexible substrate.

In a third embodiment, all the TFT elements are formed on a solid adhesive polymer layer on a first flexible polymer substrate which is laminated to a second flexible polymer substrate.

In a fourth embodiment, all the TFT elements are formed on a first flexible polymer substrate which is laminated to a second flexible polymer substrate by means of a solid adhesive polymer layer on the second polymer substrate.

In each of these embodiments the flexible polymer may itself function as the solid adhesive polymer layer. In the preferred case, the solid adhesive polymer layer is an elastomer.

In addition to the two plies implicit in the embodiments just described, additional plies may be used to implement interconnection levels. A multilevel structure that can be fabricated according to the invention is described in U. S. patent application Ser. No. 10/024,831 filed Dec. 08, 2001.

DETAILED DESCRIPTION

The key features of the method may be more easily understood with the aid of the following detailed description of the fabrication of plastic complementary inverter circuits and large area arrays of transistors having a wide range of organic semiconductors. Measurements show that the mechanical flexibility of these laminated, embedded circuits is excellent. In addition, the encapsulation that automatically follows from the lamination process yields devices that are insensitive to prolonged exposure to demanding operating conditions.

Figure 1:
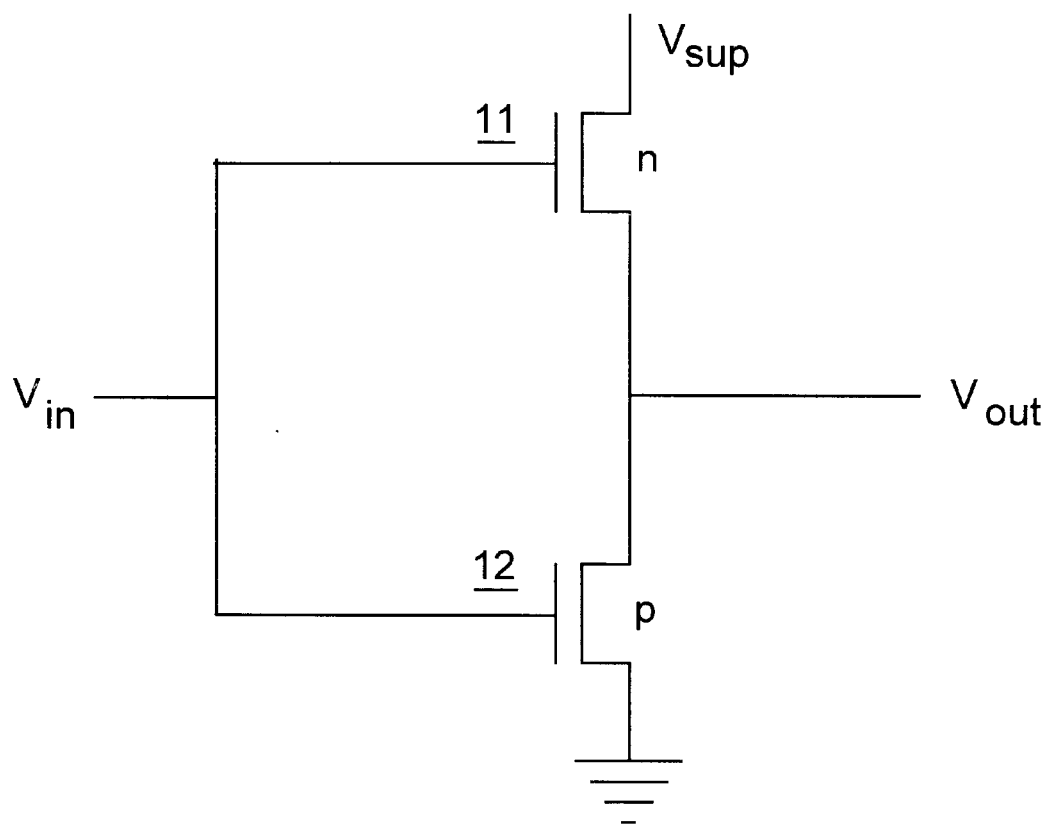
FIG. 1 is a schematic circuit diagram for a simple inverter using a CMOS pair of TFT devices fabricated in accordance with the invention.

A simple TFT transistor circuit that may be fabricated using the method of the invention uses a TFT CMOS pair in the simple inverter circuit of in FIG. 1, where n-channel TFT is designated 11 and p-channel TFT is designated 12. The p-channel transistor may be used as driver for the n-channel load.

Examples of processing sequences for making TFT devices with the lamination method of the invention are described in conjunction with FIGS. 2–15.

The TFT device used for the process illustration is a modification of the upside-down configuration that is described and claimed in U.S. patent application Ser. No. 09/137,920 filed Aug. 20, 1998, which is incorporated herein by reference. The modified TFT, which is formed in two parts on two separate plies of a laminated structure, offers several of the advantages of the up-side down configuration. It can be made with simple processing. The deposition of the semiconductor layer is relatively independent of other processing steps thus avoiding hostile process conditions such as etchants, cleaning agents, high temperature, etc. Importantly, the laminated structure, as described here, has inherent electrical isolation between devices in a CMOS pair as well as between pairs.

Figure 2:
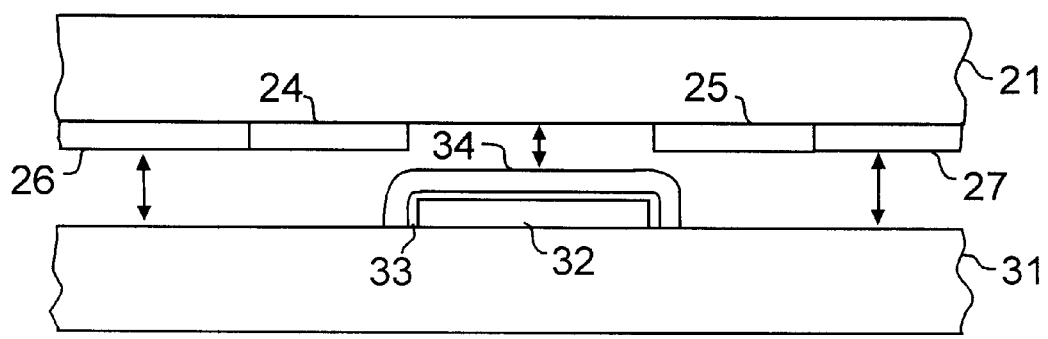
FIG. 2 is a view representing the step of assembling the flexible tapes of the invention together.
Figure 3:
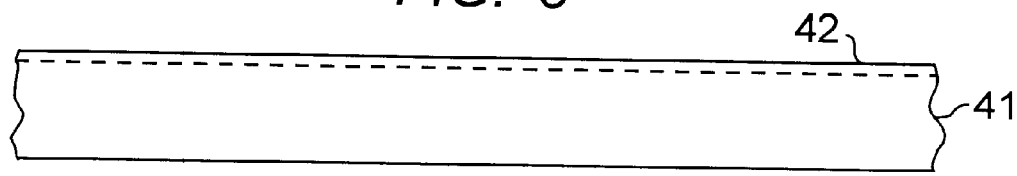
FIGS. 3–15 are schematic representations of process steps useful for forming a laminated TFT structure by the method of the invention.
Figure 4:
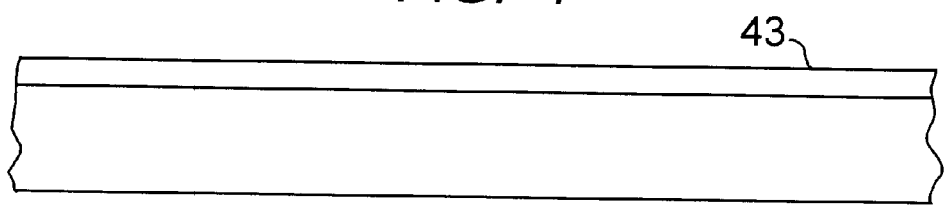
Figure 5:
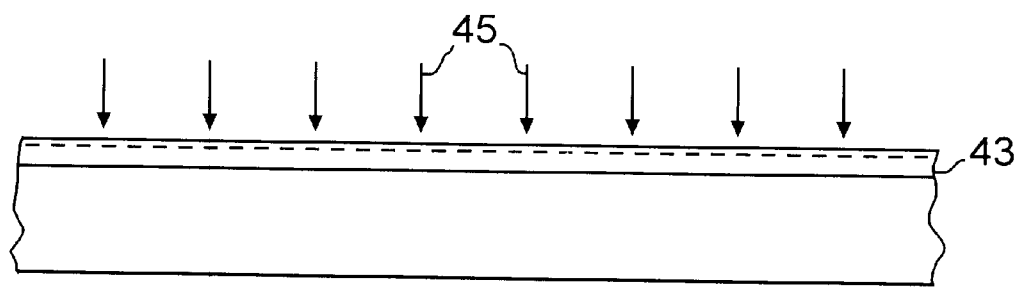

FIG. 2 illustrates the lamination approach of the invention. The basic method uses two flexible polymer substrates 21 and 31. Substrate 21 supports conformable transistor source/drain electrodes 24, 25, and appropriate runners 26, 27 for interconnecting the source and drain in the transistor circuit. The runners 26, 27 are shown as separate elements but are typically formed from the same metallization as the source and drain contacts and therefore are integral with those contacts. The substrate 31 supports the gate 32, the gate dielectric layer 33, and semiconductor layer 34. The interconnection for the gate is not specifically referenced but may extend in a direction normal to the plane of the illustration in which it has the appearance of gate 32. Laminating and permanently bonding substrates 21 and 31 together forms a complete, embedded circuit.

It should be understood that the elements shown in the figures are not to scale. The thickness of the source/drain, gate, gate dielectric and semiconductor layers is shown exaggerated for clarity. These layers are thin films, as will be evident from the description below, that do not interfere with effective lamination of substrates 21 and 31 together as described.

An important feature of the invention is the use of a solid adhesive polymer layer materials as at least the surface layer of one or both of the substrates that are laminated together. The use of a solid adhesive polymer layer materials obviates the need for applying conventional liquid adhesive, and forms a laminate that is highly reliable. Use of conventional adhesive layers between the substrates has several drawbacks. It introduces the possibility of stress failure of the laminate due to aging or other shortcomings of the adhesive. It risks failure of the TFT due to stray adhesive material covering the elements of the transistor. It adds cost and complexity to the manufacturing process.

The solid adhesive polymer layer materials preferred for the invention are polymers with an elastic modulus of less than 50 Mpa, and a frequency of 0.1–10 Hz. These parameters allow the solid adhesive polymer layer to form an essentially conformal coating over the TFT elements, and form an intimate bond between the flexible polymer substrates as well as an effective encapsulate for the TFT elements. With conformal solid adhesive layers, there is relatively little void space left in the TFT device after lamination is completed. The preferred thickness for the solid adhesive layer is 0.5 micron to 100 microns.

To be effective for tape bonding, and particularly reel tape bonding the solid adhesive polymer layers should provide for rapid bonding. Tape bonding is meant to describe a manufacturing method that employs at least two flexible substrates as continuous strips or sheets, where many transistors are formed by bonding the tapes or sheets together. Reel tape bonding describes bonding tapes that are stored on reels, and the tapes are unreeled and guided together in a mating relationship to form a single laminated tape, and the laminated tape is reeled on a take-up reel.

As mentioned above, the solid adhesive polymer layer may be used as the substrate or may be formed on a more rigid polymer substrate. Rigid in this context means still flexible, but more robust. Typically the flexible polymer substrate will have an elastic modulus of greater than 100 Mpa. Useful substrate polymers on which the elastomer is formed include polyethylene, polypropylene, polyimide, polyester, polyacrylate.

An example of a processing sequence for making laminated TFT devices according to the method of the invention is described as follows, in conjunction with FIGS. 3–19. The first step, illustrated in FIGS. 3–7, is to prepare the flexible polymer substrate with the solid adhesive polymer layer. A suitable technique begins with coating a flat glass plate 41 with a fluorinated silane monolayer 42. The surface of the glass plate is fluorinated by exposing it to a vapor of (tridecafluoro-1,1,2,2-tetrahydrooctyl)-1-trichlorosilane (United Chemical Technologies, Inc.) in a dessicator for ~2 h.

Figure 6:
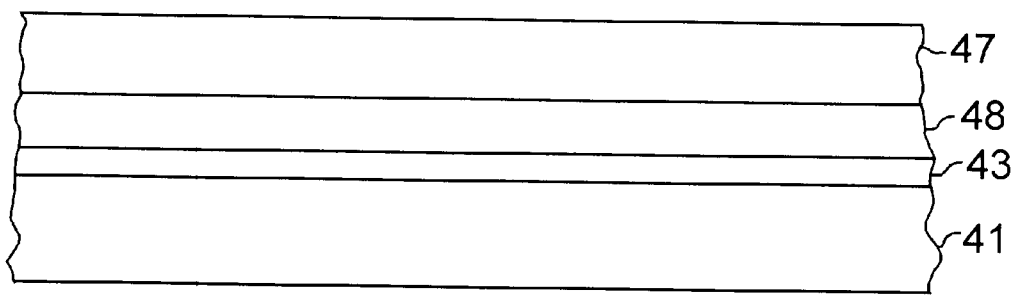

In these illustrations, surface treatments are represented by dashed lines. The fluorinated glass substrate is theri coated with elastomer by spin casting and curing a thin (25–50 $\mu$m thick) layer 43 of elastomer poly (dimethylsiloxane) (PDMS) against on the glass plate. The surface of the cured PDMS is exposed to an oxygen plasma, represented by arrows 45 in FIG. 5, for 1–2 s in a reactive ion etcher (Plasma-Therm, Inc.) with an $O_2$ flow rate of 30 standard $cm^3$ per min and a pressure of 30 mtorr at 100 V. A sheet, 47, of poly(ethylene terephthalate) (PET, thickness ~175 $\mu$m) coated with a layer 48 of indium tin oxide (ITO, thickness ~100 nm) is applied to the treated elastomer layer as illustrated by FIG. 6. This results in an irreversible bond between the PDMS and the ITO. The ITO is used only to promote adhesion; it does not serve an electrical function in this particular circuit.

Figure 7:
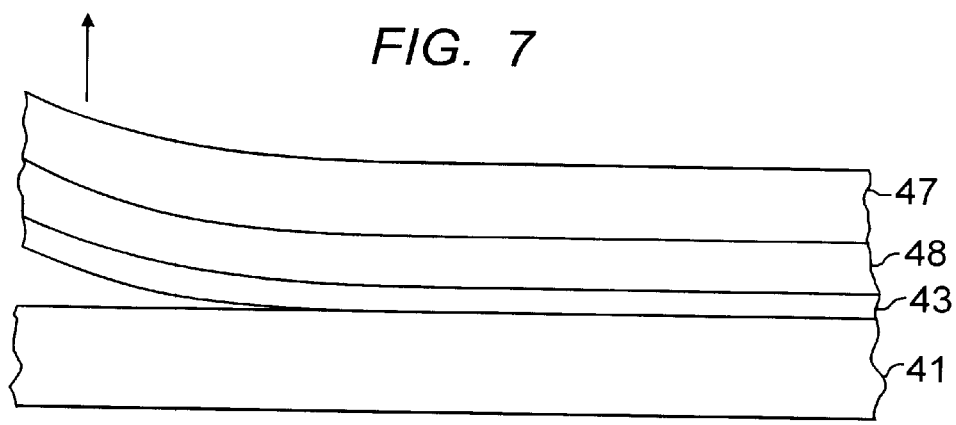

The PET layer is then peeled away from the glass surface, as illustrated in FIG. 7, thereby nondestructively releasing the PDMS from the non-stick, fluorinated surface of the glass slide. This 'transfer casting' procedure yields the flexible polymer substrate with the solid adhesive polymer layer, which in this case is an ultraflat, thin PDMS coating strongly bonded to a PET substrate.

The selected TFT elements, or circuit features, are then formed on the first flexible substrate. In this illustration the first flexible substrate corresponds to substrate 21 of FIG. 2 and contains the source and drain contacts, 24, 25, and runners 26, 27. The metal used in the TFT structures described here may be any of a variety of conductive materials. The common choice in standard IC technology is aluminum. However, due to the nature of the structures described here the choice of conductive material can be made from a larger universe than is usually considered, including the standard materials, i.e. aluminum, TiPdAu, TiPtAu, $TaN_x$, $TiN_x$, Au, Ni, etc., as well as non-traditional choices most notably copper, and conductive polymers such as polyaniline and metal-containing polymer inks. The use of polymer conductors is favored in applications where a degree of flexibility is desired. The choice of deposition technique is wide since the structures at this stage in the processing, as contrasted with traditional IC processing at this stage, have no thermally sensitive components. Thus this deposition step, as well as subsequent deposition and etching steps used for forming the two level or multi-level metallization interconnections, may involve significant substrate heating if that is otherwise convenient and cost effective. Accordingly, the metal layer can be evaporated, or sputtered. The thickness of the metal layer can vary widely, but will typically be in the range 0.05 to 2 $\mu$m.

The metal may be patterned by a variety of techniques, both additive and subtractive, including lithography, stencil printing, micrographic printing. Examples of the latter are given in co-pending applications Ser. No. 10/024,831, filed Dec. 18 2001), and Ser. No. 10/098,202, (filed on the filing date of this application), both of which are incorporated by reference herein.

An alternative method for forming the source and drain contacts is by blanket depositing metal and defining the metallization or electrode pattern using printing techniques. The following is an example of this approach.

Figure 8:
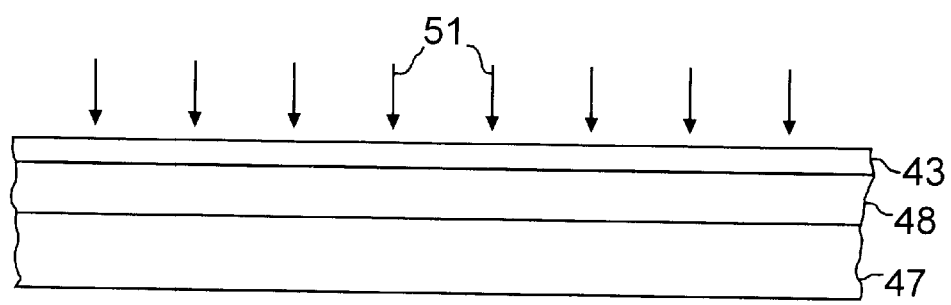
Figure 9:
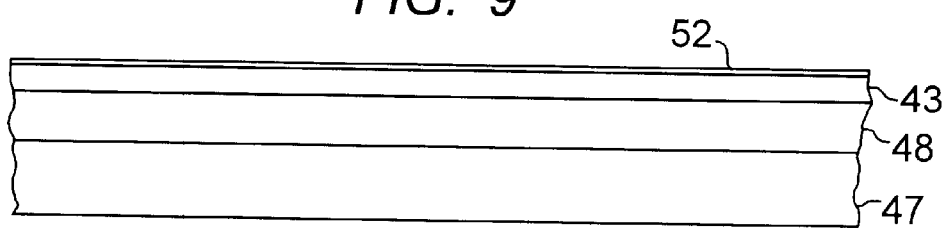
Figure 10:
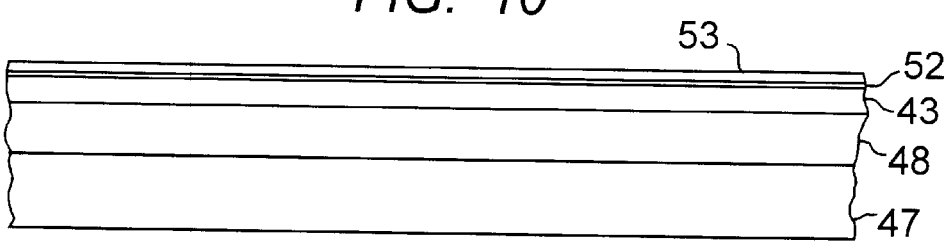

The surface of the PDMS is again exposed to oxygen plasma 51 as shown in FIG. 8. A thin layer 52 of Ti (~1 nm, at 0.3 nm/s), see FIG. 9, and a thicker layer 53 of Au (~15 nm, at 1 nm/s), see FIG. 10, are deposited on the PDMS elastomer layer by electron beam evaporation. The plasma treatment and the thin Ti layer ensure good bonding between the gold and the PDMS. The thicknesses and deposition conditions were also chosen to avoid cracking or buckling of the films. The Ti/Au layer is then patterned by microcontact printing as described by Y. N. Xia, X. M. Zhao, E. Kim, G. M. Whitesides, *Chem. Mater*. 7, 2332 (1995). This reference, as well as other references cited herein, are incorporated by reference into this application for any details useful for practicing the invention.

Figure 11:
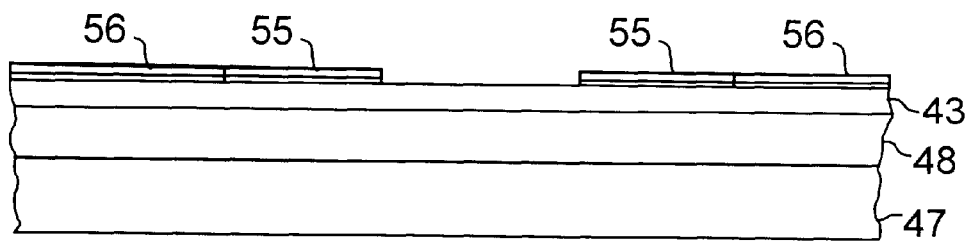

Microprinting patterns on the Au/Ti composite layer produces micron-scale circuit patterns on the PDMS. The rubber stamp in this case has features of relief in the geometry of the source/drain level (i.e. source/drain electrodes and appropriate interconnects) of the circuit. Inking this stamp with a ~2 mM solution of hexadecanethiol (HDT) and bringing it into contact with the gold-coated PDMS for ~1–2 s generates a patterned self-assembled monolayer (SAM) in the geometry of the stamp. An aqueous ferro/ferri cyanide etchant removes the gold not protected by the printed SAM. A dilute solution of HF (~1% in water) removes the Ti exposed by etching the gold. A final short plasma oxidation step produces hydroxyl groups on the exposed surface of the PDMS; it also removes the printed SAM from the gold. The result, shown in FIG. 11, is micron-sized conducting features, in this case source/drain contacts 55 and runners 56 of gold strongly bonded to the underlying PDMS.

Very high quality of circuit patterns can be printed on PDMS in this fashion. The properties of printed features on PDMS are qualitatively the same as those on rigid substrates such as glass. Resistivities of the lines in both cases are consistent with literature values. These steps complete the fabrication of the 'top' substrate for the laminated circuit.

In this embodiment, only one solid adhesive polymer layer is used. The second ply of the laminate is a flexible polymer sheet, in this case a PET sheet (thickness ~175 $\mu$m). Other polymer materials may be used to form the second substrate that supports the other parts of the circuit. Referring to FIG. 2, gate 32, gate dielectric 33, and semiconductor 33, levels were deposited and patterned using known procedures. See for example J. A. Rogers et al, *Proc. Natl. Acad. Sci. USA* 98, 4835 (2001). The gate structure shown is fabricated by patterning the gate metal prior to depositing and patterning the gate dielectric and the semiconductor layers. Other options are available. All three layers may be patterned together. Another option is to pattern the gate metal and deposit blanket gate dielectric and semiconductor layers without patterning these layers. However, the option shown allows the laminating characteristics of the bottom ply to be independent of the semiconductor laminating characteristics, and the laminating properties of PDMS with PET, as used in this example, are known to be reliable and effective.

Substrate 31 (and/or substrate 21) may also contain some source/drain level interconnects and/or contact pads and vias for interfacing the circuit to other external components (e.g. other circuits, power sources, etc.).

A variety of suitable materials are available for the gate, the gate dielectric, and the semiconductor. The gate material is preferably the same material as discussed above for the source/drain contacts. The gate dielectric material may be chosen from a variety of insulating materials such as spin on glass (SOG), or $Si_3N_4$ or $SiO_2$ deposited by CVD for example. In the TFT structures described here, it is expected that the use of polymer materials wherever they can be effective will be desirable, both from the standpoint of processing simplicity and cost, and also to produce IC structures that tolerate strain, i.e. are flexible. Accordingly, for such applications the use of polyimide or similar organic polymer insulating material is recommended. A suitable material is a polyimide supplied by Nissan Chemical Company under the designation RN-812. This material can easily be deposited in layers with 0.1–1 $\mu$m thickness, which have desirable insulating properties. Another example of such a material that has been used successfully in this application is SE-1180, also supplied by Nissan Chemical Company. This material can be spun on at 4000 RPM and cured at 120° C. for 2 hours to produce a coating with a thickness of 70 nm. The application technique for organic insulators is typically spin coating or solution casting. Some inorganic insulators, notably spin-on-glass, also share the property of convenient application. In some applications, e.g. where fine pattern dimensions are not required, the dielectric layer may be applied as a patterned layer, already containing vias if applicable.

It may be especially convenient to make the gate dielectric and the solid adhesive polymer the same layer. At least two options for placing the TFT elements are available to implement this. The source/drain and the semiconductor layer may be placed on one ply of the laminate, with the gate and gate dielectric/polymer adhesive layer on the other. Alternatively, the source/drain, semiconductor layer, and the gate dielectric/polymer adhesive layer semiconductor layer may be placed on one ply of the laminate and just the gate on the other. In either case the preferred thickness for the gate dielectric/polymer adhesive layer is less than 2 microns.

The active semiconductor layer 34 in FIG. 2, in which the field effect is realized and in which the FET channel extends between source 24 and drain 25 is an organic semiconductor. A wide variety of organic semiconductors have now been developed for TFT devices. Among these are:

i. perylenetetracarboxylic dianhydride (PTCDA), the imide derivative of PTCDA;

ii. napthalenetetracarboxylic dianhydride (NTCDA);

iii. copper hexadecafluoropthalocyanine;

iv. α-sexithiophene;

v. tetracene or pentacene, or end substituted derivatives thereof;

vi. oligomers of thiophene with the degree of oligomerization $\geq 4$ and $\leq 8$, linked via the 2- and 5-carbons;

vii. alternating co-oligomers of thienylene and vinylene, with thiophenes as terminal groups and 3–6 thiophene rings, linked via their 2- and 5-carbons;

viii. linear dimers and trimers of benzo[1, 2-b: 4, 5-b'] dithiophene;

ix. oligomers of v. and vi. with substituents (e.g., alkyl substituents with 1–20 carbons) on the 4- or 5-carbon of the end thiophenes;

x. regioregular poly(thiophene)s.

Both p- and n-type materials are contained in this list and can be combined as needed for complementary ICs. In the development of this invention the material for the p-channel TFT devices was pentacene, and the material for the n-channel devices was copper hexadecafluorophthalocyanine ($F_{16}CuPc$).

Figure 12:
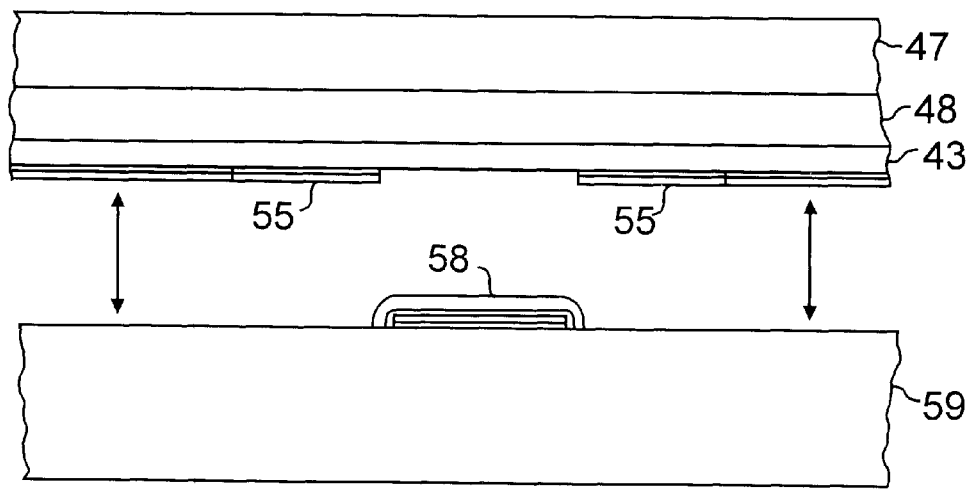
Figure 13:
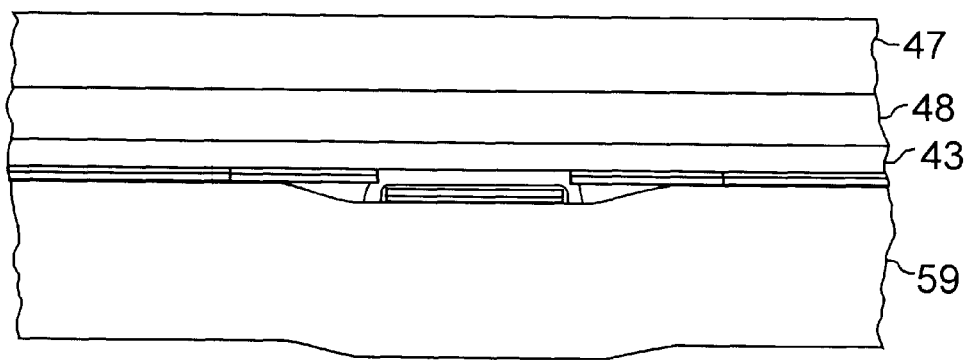

The two substrates, prepared as just described, are then laminated together. FIG. 12 shows the top substrate of FIG. 11 aligned to the bottom substrate 59. The bottom substrate 59 carries the gate structure, shown generally at 58. Aligning the top substrate with the bottom substrate, and then bringing them together completes the circuit, as illustrated in FIG. 13. Initiating contact at an edge by slightly bending one of the substrates, and then allowing contact to proceed gradually across the circuit provides a convenient way to laminate over large areas without creating trapped air pockets.

An important requirement for this lamination process is that the top substrate establishes conformal, atomic-scale contact with the bottom substrate. The thin layer of PDMS elastomer 43 is the solid adhesive polymer layer component for this process. It 'wets' the bottom substrate (over most of the substrate area, not shown in the figure) to enable this intimate contact without the use of external pressure to force the two parts together. Pressures of less than 50 psi, and in the preferred cases less than 10 psi, are contemplated. This 'wetting' yields (i) efficient electrical contact of source/drain electrodes on the top substrate with semiconductor layers on the bottom substrate and (ii) strong interfacial siloxane bonds that form from a dehydration reaction between the exposed hydroxyl groups on the two substrates (e.g. the PDMS and the glass resin for the top and bottom substrates, respectively). This single elastomer-based lamination step produces the circuit and simultaneously embeds it between the two sheets of PET without the use of conventional adhesives, and without the use of high temperatures. It also allows rapid bonding of the two flexible polymer substrates. The bonding feature may be defined as bonding with a solid adhesive polymer layer having an elastic modulus of less than 50 Mpa and a lamination frequency between 0.1–100 Hz.

Figure 14:
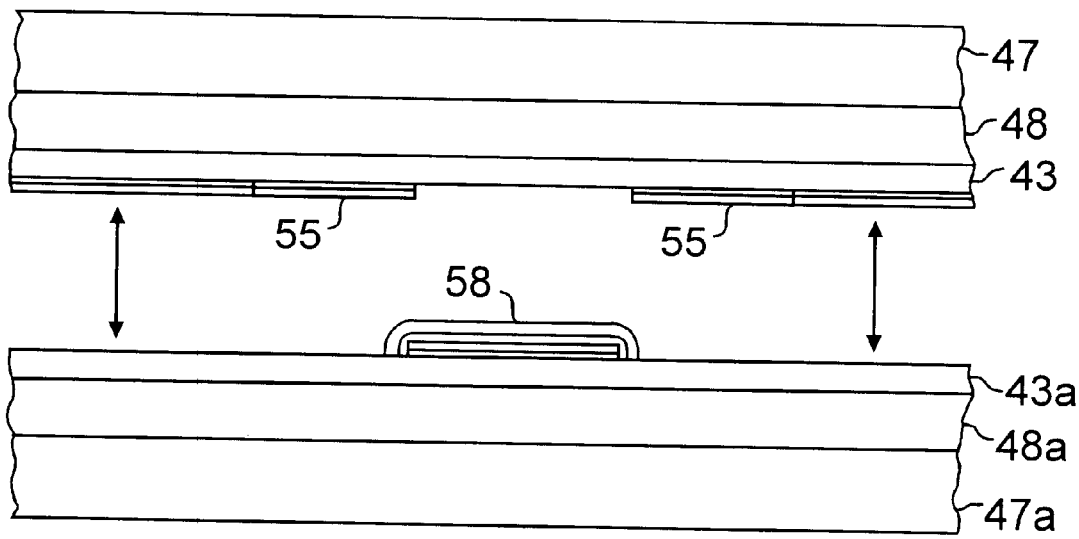
Figure 15:
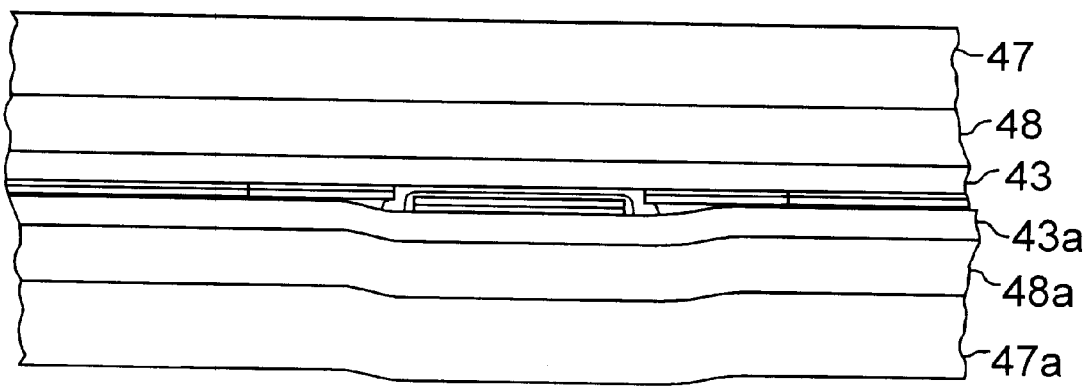

A similar result is obtained using two substrates each having a solid adhesive polymer layer. This embodiment is illustrated in FIG. 14, where the top substrate is that if FIGS. 11 and 13, and the bottom substrate, that supports gate structure 58, is the same or similar to the top substrate, i.e. it has layers 47a, 48a, and 43a, the latter being a solid adhesive polymer layer surface layer.

Figure 16:
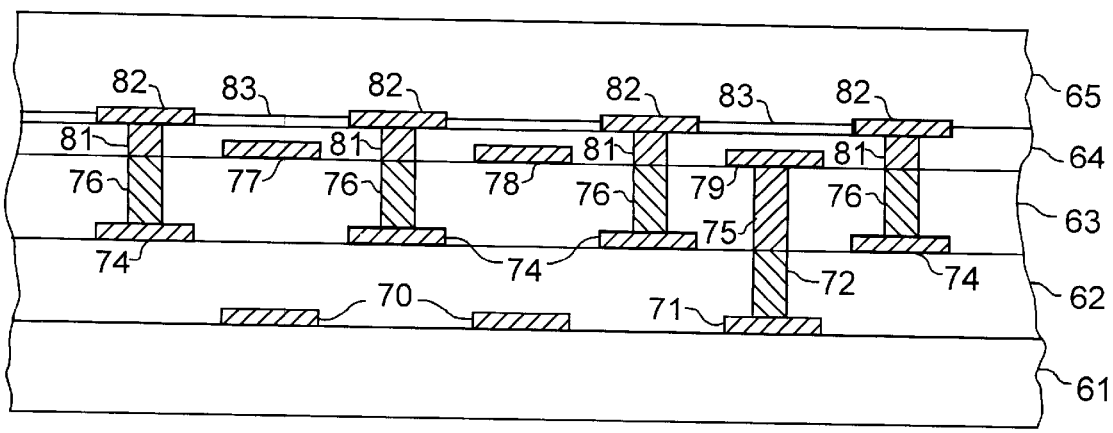
FIG. 16 is a schematic view of a multilevel laminated structure that may be made according to the invention.

More than two plies may be used to add interconnect capability, or other circuit functions. An example is shown in FIG. 16 wherein five polymer plies 61, 62, 63, 64, and 65 are laminated together. Ply 61 has printed circuit 70 that includes contact pad 71 for a gate connection. Ply 62 has a printed circuit that includes contact pads 74, and via 72. Ply 63 has printed circuit 78, MOS gates 77 and 79, via 75 that connects via 72 with gate 79, and vias 76. Ply 64 contains source/drain electrodes 82, and vias 81 for connecting vias 76 in ply 63 with the source/drain contacts. Ply 65 contains semiconductor layers 83 on the bottom surface and serves to complete and seal the circuit. Each of plies 61–65 either contains a solid adhesive polymer layer on one or both surfaces, or it contacts a solid adhesive polymer layer. It will be understood that the arrangement shown is illustrative of the versatility of laminated circuits made according to the invention, and a variety of other circuits and interconnection assemblies may be implemented in similar fashion.

For preferred solid adhesive polymer layer materials, simple contact and mild pressure will be sufficient for the solid adhesive polymer layer to wet another ply of the laminate. This is especially the case where each flexible polymer substrate has a solid adhesive polymer layer. In some cases, heating may be desirable to "cure" the solid adhesive polymer layer. Another alternative is to add a UV photoinitiator to the solid adhesive polymer layer, and use UV radiation, typically in the form of UV lamps, to cross-link the polymer(s) in the solid adhesive polymer layer layers.

For the purpose of defining flexible polymer substrates, a bend radius of less than 1 meter is suitable, and less than 5 cm. is preferred.

Figure 17:
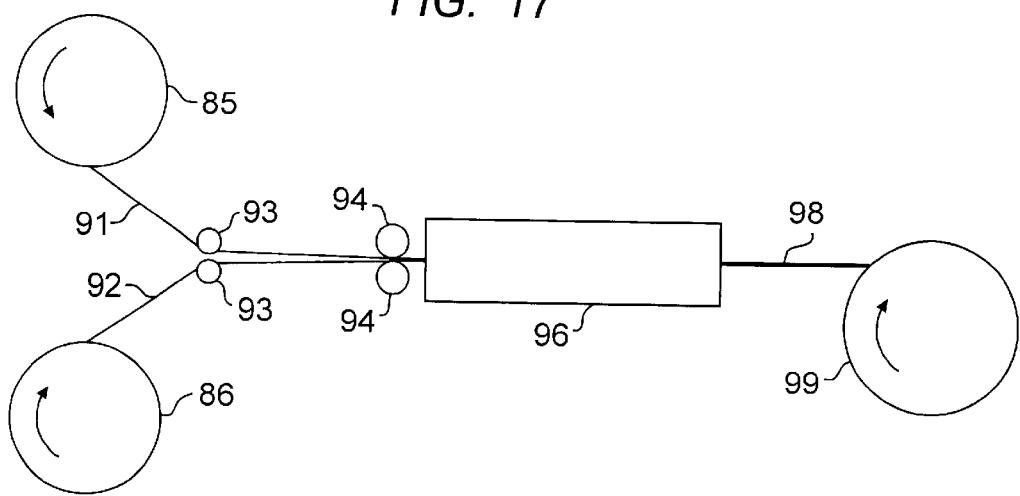
FIG. 17 is a schematic representation of a reel-to-reel assembly operation for the manufacture of flexible TFT tapes.

As mentioned earlier, it would be desirable to have a simple and reliable lamination method that allows implementation of reel-to-reel manufacturing methods. A schematic arrangement for achieving reel-to-reel assembly of the laminations, described in connection with FIGS. 2–16, is illustrated in FIG. 17. Reels 85 and 86 carry two plies of a laminated TFT tape 91 and 92. The tapes are reeled through control and alignment spools 93, which may actually involve many spools, for handling the tape. The two plies are fed into rollers 94 that press the two plies together. The unified tape is shown guided through curing station 96, which is optional and in the preferred case is not used. In cases where it is used it will typically provide heat or UV radiation. The laminated tape 98 is then reeled onto take-up drum 99.

Using the lamination method of the invention, the mechanical properties of the devices are greatly improved. For instance, flexibility of conventional plastic circuits is typically limited by the mechanical properties of the most brittle component, which is often one of the active components of the device (e.g. the organic semiconductor or the gate dielectric). By laminating the circuits, the flexibility is no longer limited by that, but is now wholly dependent on the mechanical properties of the plastic substrate.

Various additional modifications or extensions of this invention will occur to those skilled in the art. All deviations from the specific teachings of this specification that basically rely on the principles and their equivalents through which the art has been advanced are properly considered within the scope of the invention as described and claimed.

We claim:

1. A method for manufacturing a thin film transistor (TFT) device, the TFT device comprising TFT elements, comprising the steps of:

a. preparing a first substrate, the substrate comprising a polymer material, by forming a solid adhesive polymer layer on the substrate, and forming at least one TFT element on the solid adhesive polymer layer layer, b. preparing a second substrate, the substrate comprising a polymer material, by forming at least one TFT element on the substrate, and c. laminating the first and second substrates together.

2. The method of claim 1 wherein the first and second substrate are continuous tapes.

3. The method of claim 1 wherein the TFT elements on the first substrate comprise source and drain electrodes and the TFT elements on the second substrate comprise TFT gates, gate dielectric layers, and semiconductor layers.

4. The method of claim 1 wherein one of the TFT elements is a gate dielectric layer and the gate dielectric and the solid adhesive polymer layer are the same.

5. The method of claim 1 additionally including the step of forming a solid adhesive polymer layer on the second substrate and forming at least one TFT element on the solid adhesive polymer layer.

6. The method of claim 2 wherein the tapes are reeled onto reels, then reeled off the reels and pressed together to laminate them together.

7. The method of claim 1 wherein the substrates are laminated together at room temperature.

8. The method of claim 1 wherein the substrates are laminated together using UV radiation.

9. The method of claim 1 wherein the solid adhesive polymer layer is PDMS.

10. The method of claim 9 wherein at least one of the substrates comprises PET.

11. The method of claim 1 wherein the substrates are laminated together using a pressure of less than 50 psi.

12. A method for manufacturing a thin film transistor (TFT) device comprising:

a. preparing a first substrate, the substrate comprising a polymer material, by forming a solid adhesive polymer layer on the substrate, and forming the TFT transistor on the solid adhesive polymer layer, b. preparing a second substrate, the substrate comprising a polymer material, and c. laminating the first and second substrates together.

13. The method of claim 12 wherein the second substrate has a solid adhesive polymer layer.

14. The method of claim 13 wherein the substrates are laminated together using a pressure of less than 50 psi.

15. A method for manufacturing a thin film transistor (TFT) device comprising:

a. preparing a first substrate, the substrate comprising a polymer material, and forming the TFT device on the polymer material, b. preparing a second substrate, the substrate comprising a polymer material by forming a solid adhesive polymer layer on the substrate, and c. laminating the first and second substrates together.

16. The method of claim 15 wherein the substrates are laminated together using a pressure of less than 50 psi.

* * * * *